(12) United States Patent
Hofmann et al.

(10) Patent No.: US 9,054,636 B2
(45) Date of Patent: Jun. 9, 2015

(54) MICROMECHANICAL RESONATOR ARRANGEMENT

(71) Applicant: Fraunhofer-Gesellschaft zur Förderung der angewandten Forschung e.V., München (DE)

(72) Inventors: Ulrich Hofmann, Itzehoe (DE); Joachim Janes, Itzehoe (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 49 days.

(21) Appl. No.: 14/103,227

(22) Filed: Dec. 11, 2013

(65) Prior Publication Data
US 2014/0159827 A1    Jun. 12, 2014

(30) Foreign Application Priority Data

Dec. 12, 2012 (DE) .......................... 10 2012 222 988

(51) Int. Cl.
| G02B 26/08 | (2006.01) |
| H03B 5/30 | (2006.01) |
| B81B 3/00 | (2006.01) |
| H03H 9/00 | (2006.01) |
| G02B 26/10 | (2006.01) |

(52) U.S. Cl.
CPC ................ *H03B 5/30* (2013.01); *B81B 3/0018* (2013.01); *H03H 9/00* (2013.01); *G02B 26/0833* (2013.01); *G02B 26/10* (2013.01)

(58) Field of Classification Search
CPC ...... B81B 3/0018; H03B 5/30; H03H 3/0072; H03H 9/00; G02B 26/0841; G02B 26/0858; G02B 26/101; G02B 26/0833; G02B 26/10
See application file for complete search history.

(56) References Cited

U.S. PATENT DOCUMENTS

| 5,543,956 A | 8/1996 | Nakagawa et al. |
| 6,975,442 B2 | 12/2005 | Gessner et al. |
| 2012/0307211 A1 | 12/2012 | Hofmann et al. |
| 2012/0320379 A1* | 12/2012 | Hofmann et al. ............. 356/445 |

FOREIGN PATENT DOCUMENTS

| DE | 102009058762 A1 | 6/2011 |
| WO | WO-02/099504 | 12/2002 |

* cited by examiner

*Primary Examiner* — James Phan
(74) *Attorney, Agent, or Firm* — Schwegman Lundberg & Woessner, P.A.

(57) ABSTRACT

The invention relates to a micromechanical resonator arrangement, in particular micro-mirror scanner with an inner actuator, which comprises an oscillation body capable of oscillation about at least one axis, and with an outer actuator with an oscillating part. The inner and outer actuator form a coupled oscillation system, and the outer actuator is driven by an external drive whose drive frequency is selected in a manner such that the oscillation body of the inner actuator oscillates with one of its eigenmodes or close to this eigenmode. The inner actuator is at least one vacuum-encapsulated microactuator chip which is fastened on the oscillating part of the outer actuator.

13 Claims, 4 Drawing Sheets

MICROMECHANICAL RESONATOR ARRANGEMENT

CLAIM OF PRIORITY

This application claims the benefit of priority of German Patent Application Ser. No. 10 2012 222 988.4, entitled "MIKROMECHANISCHE RESONATORANORDNUNG," filed on Dec. 12, 2012, the benefit of priority of which is claimed hereby, and which is incorporated by reference herein in its entirety.

TECHNICAL FIELD

The invention relates to a micromechanical resonator arrangement according to the preamble of the main claim.

BACKGROUND

Micromechanical resonators, also called MEMS resonators, are applied in sensors, e.g. in rotation rate sensors and actuators, e.g. scanners. A variety of drive principles, such as thermal, electrostatic, piezoelectric or electromagnetic drives are known from the state of the art. One of the basic problems, in particular of MEMS actuators, is the very weak forces which can be realised with the known technologies of micro-technology on a wafer level. For this reason, often therefore only disadvantageously small masses can be moved adequately quickly or far. The great potentials with regard to the inexpensive mass production, the high obtainable precision and low component scatter in many cases, therefore do not come to fruition, since greater masses are to be moved in numerous applications. Micro-technology and macro-technology therefore continue to remain far apart, despite a great convergence.

A resonance scanner which comprises a drive plate suspended on a fixed frame via torsion springs, in a manner such that the torsion plate can oscillate about a torsion axis is known from WO 2002/099504. A mirror is fastened within and on the drive plate, likewise via torsion springs, such that it is capable of oscillation about a further torsion axis. Moreover, a drive means is arranged on the frame, by way of which force can be exerted onto the drive means. The drive plate is thus excited into oscillation by the drive means, said oscillation being transmitted onto the mirror lying in the drive plate. The drive means is activatable in a manner such that the force exerted onto the drive plate follows a periodic function, whose period is matched to the natural frequency of the mirror. Such a resonance scanner is relatively sensitive with regard to its construction, and the desired deflections of the mirror are damped in an undesired manner by the surrounding atmosphere.

SUMMARY

In the field of micro-technologically manufactured micromirrors, there exists the significant need to close the gap to conventionally manufactured galvanometer scanners which are capable of moving mirrors having mirror apertures of several centimeters, to large deflection angles. Micro-technology usually stops at mirror apertures of a few millimeters. Most commonly, mirrors with a diameter of about 1 mm are realised due to the reasons of too small available forces, and this significantly restricts the application possibilities.

Vacuum encapsulation has been found to be a very advantageous method to overcome the shortcomings of the realisable forces and torques, with which vacuum encapsulation the resonator is surrounded by a hermetically closed and at the same time evacuated housing, by which means one succeeds in minimising the damping of the micro-actuator due to the surrounding air. The actuator loses less energy per oscillation period by way of this and can thus often accumulate the energy externally led to it over several thousand oscillation periods, until a maximal oscillation amplitude finally sets in. On account of this advantage which lies in minimising the energy losses, it has been possible in recent times to develop resonant MEMS scanners which are a multiple larger than non-encapsulated MEMS mirrors. However, the disadvantage of the too low forces which are available exits, and the advantage achieved due to the vacuum encapsulation until now has not yet been sufficient to seriously challenge conventional polygon scanners and galvanometer scanners.

It is therefore the object of the invention, to create a micromechanical resonator arrangement which, with low energy losses, permits an increased oscillation amplitude compared to the state of the art and which has a relatively simple construction, so that the manufacture of the resonator arrangement is also simplified.

According to the invention, this object is achieved by the characterising features of the main claim in combination with the features of the preamble.

Advantageous further developments and improvements are possible by way of the measures specified in the dependent claims.

According to the invention, the micromechanical resonator arrangement, which in particular is designed as a micromirror scanner, comprises an inner actuator having an oscillation body capable of oscillation via at least one axis, and an outer actuator with an oscillating part, wherein the inner and outer actuator form a coupled oscillation system. The outer actuator is driven by an external drive, whose drive frequency is selected such that the oscillation body of the inner actuator oscillates with one of its eigenmodes (natural modes) or close to this eigenmode (depending on the resonance frequencies, between +−1%-10% of the resonance frequency). The inner actuator is designed as at least one vacuum-encapsulated micro-actuator chip, wherein this chip is fastened in a stationary manner on the oscillating part of the outer actuator. Thereby, "inner actuator" is also to be understood as a mechanical oscillatory structure which is equipped without its own drive, i.e. is a passive, oscillatory resonator structure.

Due to the micromechanical resonator arrangement according to the invention, it is possible to set the oscillation body of the micro-actuator chip, i.e. the oscillating mirror of a scanner, into oscillations of a greater amplitude by way of the external drive and via the external actuator, even if it is the case of a large oscillation mass of a high movement of inertia of the oscillation body which usually cannot be realised in a meaningful manner for MEMS resonators, or however also a very high frequency. The drive parameters of the external drive, such as drive frequency and drive amplitude, are selected in a manner matched to the parameters of the inner and outer actuator, such as moment of inertia and spring stiffnesses, such that the oscillating part of the outer actuator moves with a low excitation amplitude, but a large amplitude amplification or angle-amplitude amplification is achieved with respect to the oscillation body of the micro-actuator chip. For example, with a laser scanner, usually no laser beam deflection which originates from the vibration or the oscillation of the external actuator is to be recognised, but only one which has its origin in the excitation of the oscillation body of the micro-actuator chip.

Oscillation amplitudes which are greater than those with the available integrated drives known from micro-technology by a factor of 10 to 1000 can be achieved with the resonator arrangement according to the invention.

Two application examples which can be realised with the resonator arrangement according to the invention are hereinafter given.

EXAMPLE 1

An MEMS-mirror with a scan frequency of 40.50 kHz would be necessary for example for the horizontal deflection for a laser projection display with HDTV resolution (1080×1920) (amongst other things depending on the performance, with which the associated vertical mirror operates). In order to be able to keep the dynamic deformations occurring during the movement so small, that the resolution is not significantly reduced, it is necessary for the mirror plate, instead of an otherwise common thickness of 80 micrometers, to now have a thickness between 500 μm and 2 mm. This is only the frequency requirement. A product of the mirror plate and mechanical angle amplitude (single-sided mechanical maximum deflection of the mirror plate) of at least 22 degrees*millimeter is necessary for the pixels to be really optically separated from one another. The forces necessary for this deflection and speed until now have not been achieved with any of the known methods of micro-technology, although one has been working on this problem for many years at different locations around the world. The problem however can be solved with the arrangement which is described in this invention, since one the one hand the vacuum encapsulation ensures that the energy led from the outside is conserved to a very high percentage, and energies which can be made available in many orders of magnitude greater than with micro-technology, can be supplied from to outside.

EXAMPLE 2

Until now, no MEMS mirror has been applied for laser material machining with laser powers of many hundreds of watts to several kilowatts, due to the act that dielectric mirroring layers with extremely high degrees of reflection must be applied due to the high laser powers, and these layers have an extremely high layer stress, which would lead to the MEMS mirrors bending too greatly and not being able to be meaningfully applied on account of this. One can only counteract the layer stress by way of greatly increasing the mirror thickness of the MEMS scanner. Only mirror plates of a wafer thickness are considered and at the same time mirror apertures of 20 mm diameter are required. The forces and torques which can be realised with MEMS technology are orders of magnitude too small in order to be able to move such large mirrors adequately rapidly (a few 100 Hz to a few kHz), with angle amplitudes of a few degrees. Such MEMS scanners however can be realised with the resonator arrangement designed according to the invention.

The vacuum-encapsulated micro-actuator chip as an MEMS resonator is preferably fastened on the oscillating part of the outer actuator by way of gluing, soldering, bonding or likewise. The particular advantage of the micromechanical resonator arrangement according to the invention amongst other things is to be seen in the fact that, as was hitherto the case, it is possible to provide MEMS resonators in the form of micro-actuator chips of extremely high precision and low component fluctuation with a precisely defined matching of the resonance frequencies and oscillation characteristics by way of high-resolution photolithography and a highly precise layer deposition method and etching techniques on the wafer level, whereas an outer actuator which is manufactured in a comparatively simple manner and as a rule with less precision and thus inexpensively, only has the task of providing sufficient oscillation energy at a certain excitation frequency and transmitting it to the inner MEMS resonator. The inexpensive parallelised mass production capability is addressed by way of each manufacturing method, thus the MEMS manufacture as well as the manufacture of the conventional outer oscillator, in each case being able to taking place in manufacturing environments which are tailored to them and optimised for them. A later assembly can be carried out without danger of damage of the parts of the chip, even though the environmental conditions on assembly of the complete micromechanical resonator arrangement do not necessarily need to have cleanroom quality, due to the fact that the MEMS component is already present in an encapsulated manner as a micro-actuator chip. As specified the term "micromechanical" in the definition "micromechanical resonator arrangement" is essentially related to the micro-actuator chip, whereas the outer actuator is manufacturable with conventional technology, as a rule with reduced demands with regard to the precision. In the embodiment as a scanner, the invention permits the realisation of MEMS mirrors for laser video projection in HDTV resolution, since the resulting scanner characteristics very significantly depend on the structure definition of the MEMS chip and only to a much reduced extent on the outer actuator. It is merely a case of this actuator being able to transmit vibration energy, force and/or torque at a desired frequency in an adequately manner.

In an advantageous manner, the outer actuator is designed as a resonant spring-mass system which as an oscillating part comprises a platform which is suspended via at least one spring and is for receiving the micro-actuator chip. Thereby, the design of the resonant spring-mass system with regard to the spring constants and moments of inertia can be designed depending on the natural resonance frequency of the oscillation body of the vacuum-encapsulated micro-actuator chip which is capable of oscillation. The platform can be mounted in a fixed manner via the at least one spring at one side, but also at two sides with accordingly two springs. The design of the spring or springs, whilst taking into account the moment of inertia, can be selected such that the natural resonance of the outer resonator or actuator is preferably lower than that of the MEMS resonator, but it may also be the case that it is desirable to select the natural resonance of the outer actuator greater than that of the MEMS resonator. Both designs could be advantageous with regard to the characteristic of the complete coupled oscillation system, depending on the application and the set aims.

The external drive assigned to the outer actuator can be designed as an electromagnetic, piezoelectric, electrostatic, pneumatic or thermo-mechanic drive. Electromagnetic drives are particularly advantageous, since these in contrast to piezo-actuator stacks which could basically also be considered, have the advantage that additionally to the high producible forces they also permit a large displacement, thus actuation travel or amplitudes. The smaller realisable actuation displacements of piezo-actuators in many cases however are fully sufficient to set the completely encapsulated, high-quality MEMS chip, in a manner matched to the natural resonance or to the natural resonances of the inner MEMS actuator, into sufficient large oscillation. The often greater frequency bandwidth of piezo-actuators, particularly with MEMS resonators to be activated in a very high-frequency manner, e.g. ≥20 kHz, is an advantage compared to electromagnetic drives.

In another embodiment, it is conceivable for the outer actuator to be designed as a non-resonant, regulated (closed-loop controlled) actuator system. Such a non-resonant, regulated actuator system can be a mounted system, for example the rotatable pivot of a galvanometer scanner or of an electric motor. The electric motor for example can move or rotate the oscillating part of the outer actuator which is designed as a platform, to and fro, so that the oscillatory oscillation body of the micro-actuator chip can oscillate according to its natural resonance and thus an amplitude amplification or angle amplitude amplification can be achieved.

In a preferred embodiment example, the oscillating part of the outer actuator which is designed as a platform, at least partly is a magnetisable material or is connected to at least one permanent magnet, wherein the external drive comprises an electromagnet. The oscillatory part of the outer actuator for example can be designed as a steel plate mounted or fixed at one side or two sides, wherein the electromagnet of the external drive is activated such that it pulls or repels the platform according to the desired movements of this.

However, it is also conceivable for the oscillatory part with the spring structure of the outer actuator to be manufactured from a circuit board substrate. In this case, the vacuum-encapsulated micro-actuator chip can be mounted on the circuit board and also be contacted there. The contact pads can be placed on the circuit board, in order to permit wire bond connections between the chip and strip conductor on the circuit board substrate. From there for example, a strip conductor can be led also to an externally seated signal processing unit and driver unit which can be designed as an ASIC. The complete system can moreover be designed in a very compact manner and apart from the signal-technological electronic functionality can also co-integrate mechanical-dynamic functionality.

Another possibility of the drive of the oscillatory part of the outer actuator lies in providing the platform or a circuit board substrate forming the platform, with a coil which co-operates with a permanent magnet arrangement as a constituent of the external drive for forming a moving coil. With a moving coil arrangement, a copper planar coil which surrounds the MEMS micro-actuator chip assembled in a preferably centred manner, is produced on the circuit board substrate, wherein the drive signals of the external drive are led to the coil, and given a flow of current, the platform of the outer actuator is set into movement out of the idle position in the static magnetic field of the permanent magnet arrangement.

According to the invention, an outer actuator can also be manufactured, whose spring-mass system is manufactured of a wafer level of silicon, but which is driven by externally added drives such as by a combination of permanent magnet and electromagnet or by soft magnet and electromagnet or by way of a moving coil arrangement or a piezo-stack. The central component of the invention is always the vacuum encapsulated micro-actuator chip which as a whole with the outer actuator operated under atmospheric pressure is driven preferably by conventionally manufactured macro-drives.

In one advantageous embodiment example, the drive signals of the external drive for the oscillation excitation of the outer and inner actuator are composed of at least two signals which are different with regard to the frequency and/or the signal shape. One possibility of forming a drive signal is for example a sawtooth course with a relatively low frequency (e.g. of the order of magnitude of a few tens of Hz to a few hundred Hz), onto which a vibration of a very higher frequency, matched to the resonance frequency of the inner resonator, is superimposed. With this, the outer actuator in an advantageous manner can trigger a desired resonant oscillation of the MEMS resonator, i.e. of the oscillatory oscillation body as well as carry out a sawtooth-shaped movement which is led in a controlled manner and is superimposed thereon. Thereby, of course one can also provide different signal shapes or movement forms.

Depending on the design of the outer actuator, a movement of the inner actuator or inner resonator in two axes orthogonal to one another is also possible, i.e. the oscillatory oscillation body of the micro-actuator chip is suspended on two orthogonal axes (pivots) with an oscillation frequency assigned to each axis (pivot). The drive signal can thereby be a signal superimposed from two signals with the respective frequencies, or an electric signal which comprises a frequency mixture containing the desired oscillation frequencies. For example, with drive signals of the external drive which are composed of two different signals, a sawtooth-shaped movement of the complete resonator arrangement along a first axis or rotation axis, and perpendicular thereto a movement e.g. at a much higher frequency in the axis or rotation axis which is perpendicular thereto can result. It is possible with such an arrangement, to vertically realise a deflection of a laser bean in sawtooth operation, whereas perpendicularly thereto the micro-actuator chip is excited into resonance at a very much higher frequency. With this, for example a raster scan can be realised for a high-resolution, picture-providing sensor system or a high-resolution laser projection display.

In an advantageous further formation the micro-actuator chip comprises an external drive, which is assigned to the oscillation body and which serves for damping the oscillation of the oscillation body or for the drive of an oscillation pivot (axis) of the oscillation body which is not excited by the external drive. It can make sense or be desirable for the amplitude of the oscillation of the oscillation body of the micro-actuator chip to be able to be influenced in a targeted manner with the help of a controllable damping accommodated on the encapsulated chip. Such a damping can be realised for example by a drive with rotor electrodes and stator electrodes which mesh into one another in a comb-like manner and to which a voltage adaptable in its magnitude is applied. The arising electrostatic forces can damp the oscillation movement is a targeted manner, e.g. if the amplitude should be become too large due to the outer actuator, the oscillation body can be rapidly readjusted by way of applying a modulated voltage acting in a braking manner, to the electrodes of the internal drive. An integral drive would also be conceivable, in order to drive a pivot which is not excited externally, e.g. with two-pivot (two-axis) oscillation bodies.

In a particularly preferred embodiment, the micro-actuator chip is provided with sensors for detecting the oscillation amplitude, the oscillation frequency and/or the oscillation phase. These sensors can for example detect the desired parameters by way of capacitive, piezoelectric, piezoresistive or inductive detection, wherein the sensor signals can be led away to a signal processing unit provided outside the micro-actuator chip.

BRIEF DESCRIPTION OF THE DRAWINGS

The invention is represented in the drawing and is explained in more detail in the subsequent description. There are shown in.

DETAILED DESCRIPTION

Figure 1:
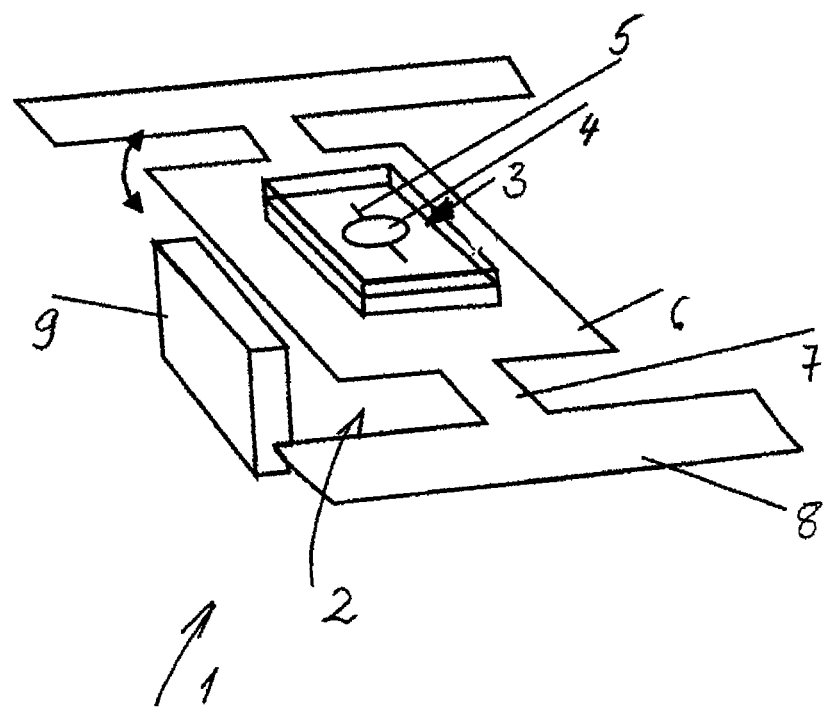
FIG. 1 a schematic perspective view of a micromechanical resonator arrangement according to a first embodiment example of the invention, FIG. 2 a schematic section through a micromechanical resonator arrangement according to the invention and according to a second embodiment example, FIGS. 3-5 possibilities of the arrangements of the micro-actuator chip on the oscillatory part of the outer actuator, FIG. 6 a schematic section through a third embodiment example of the invention, FIG. 7 a schematic section through a fourth embodiment of the micromechanical resonator arrangement according to the invention, and FIG. 8 a graph of the frequency response (amplitude over frequency) of the micromechanical resonator arrangement according to the invention.

The micromechanical resonator arrangement 1 according to the invention is represented schematically in FIG. 1 and comprises an outer actuator 2 and an inner actuator 3, wherein the inner actuator is designed as a vacuum-encapsulated micro-actuator chip 3 which in the embodiment example is a MEMS mirror. The micro-actuator chip 3 comprises a mirror plate 4 as an oscillatory oscillation body which can be suspended via torsion springs 5 in a single-pivot or two-pivot (one-axis or two-axis) manner, wherein one pivot is indicated in FIG. 1.

The outer actuator 2 comprises an oscillatory platform 6 which e.g. consists of a soft-magnetic material and which is mechanically fixed via two springs 7 lying opposite one another, on a mechanical fixation or fastening 8. The outer actuator is driven by an external drive 9 which in the embodiment example is designed as an activatable electromagnet.

The vacuum encapsulated micro-actuator chip which has a quality factor of at least greater than 2000, preferably greater than 20,000 is glued, soldered, bonded onto the platform or mechanically connected to this in another manner The inner actuator or the micro-actuator chip 3 has at least one natural resonance frequency which depends on the spring stiffness of the torsion springs 5 and on the mass of the mirror plate 4. The outer actuator also has a natural frequency which is usually lower than that of the micro-actuator chip 3 and is likewise determined by the spring constants of the springs 7 and the moment of inertia of the plate.

The external drive 9 or the electromagnet is activated by drive signals, wherein the frequency and the amplitude of the drive signals are selected such that the mirror plate of the vacuum-encapsulated micro-actuator chip 3 oscillates in at least one of its eigenmodes or close to this eigenmode and has an amplified oscillation amplitude compared to the oscillation amplitude of the oscillatory platform 6 which is called the excitation amplitude. The frequency of the external drive 9 is thus selected such that the electromagnet is operated at the frequency of the desired natural resonance of the micro-actuator chip 3, as the case may be also with half or double or accordingly higher frequency, by way of which the mirror plate 4 can be excited into oscillation.

A functional example is explained hereinafter. The outer actuator 6 in accordance with the drive signals of the external drive 9, can e.g. on the one hand produce a non-resonant 60 Hz oscillation with a sawtooth course at an amplitude of e.g. +/−10 degrees, whereas simultaneously a vibration matched to the resonance frequency of the inner resonator 3 is superimposed and which, as already previously described, serves for exciting the MEMS resonator into greater resonance amplitudes—preferably perpendicularly to the sawtooth movement. The electromagnet in this case would have a 60 Hz sawtooth signal of a large amplitude and a high-frequency superimposed signal of a significantly smaller amplitude fed to it. The sawtooth movement is also experienced by the complete assembled MEMS chip 1. The vibration superimposed for this is likewise transmitted onto the MEMS chip 1 and there excites the integrated oscillation body 4 into oscillation.

The procedural manner for manufacturing such a micromechanical resonator arrangement according to FIG. 1 is as follows:

Firstly, a single-pivot or multi-pivot MEMS resonator with highly precise, defined spring-mass characteristics, preferably with an integrated amplitude feedback, phase feedback and frequency feedback is manufactured. Subsequently, the MEMS resonator is vacuum encapsulated, preferably on a wafer level and preferably with an activatable getter integrated in the housing for achieving a quality factor of at least greater than 2000, preferably greater than 20000, by which means the microencapsulated micro-actuator chip 3 is manufactured.

Subsequently, an outer, firstly passive oscillator preferably designed as a spring-mass system is produced. Hereby, it can also already be the case of a parallelised manufacture on a wafer level or a circuit board level.

Thereafter, the vacuum-encapsulated micro-actuator chip is assembled on the outer oscillator or outer actuator and mechanically connected and contacted. Subsequently, a suitable, conventional, in the embodiment example, electromagnetic drive is assembled on the outer actuator.

Figure 2:
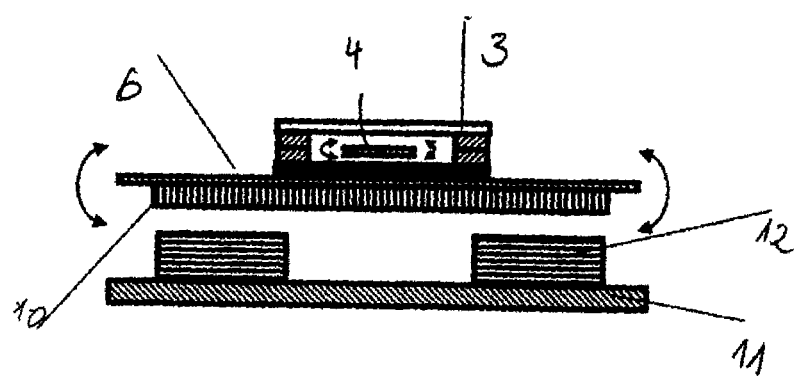

A further embodiment example of the resonator arrangement according to the invention is shown in FIG. 2, wherein here the external drive is designed differently to that according to FIG. 1. The micro-actuator chip 3 is fastened on the platform 6 of the outer actuator 2, i.e. glued, soldered, bonded or connected in another manner, wherein the platform 6 does not necessarily need to consist of a magnetisable material, but is manufactured for example of a circuit board material. One or more permanent magnets 10 which are opposite electromagnets 12 fastened on an assembly plate 11 are arranged below the platform 6. The electromagnets 12 are activated with drive signals at a frequency according to the natural resonance frequency of the micro-actuator chip 3. By way of this, the platform 6 is moved according to the represented arrow, and the movement is transmitted with amplified amplitude onto the mirror plate 4.

Figure 3:
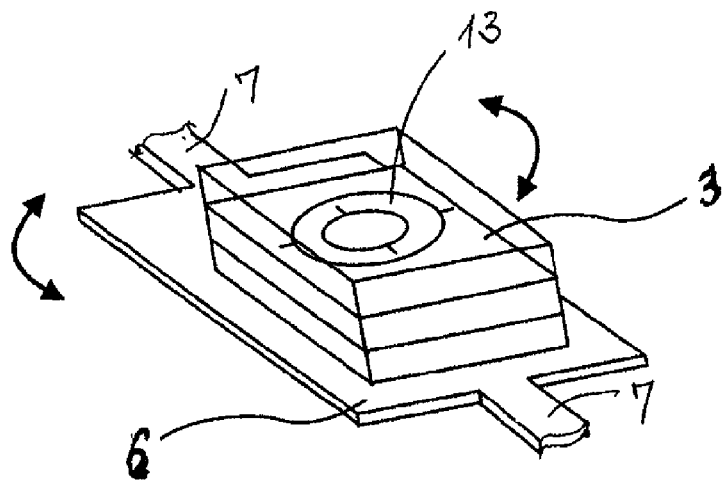
Figure 4:
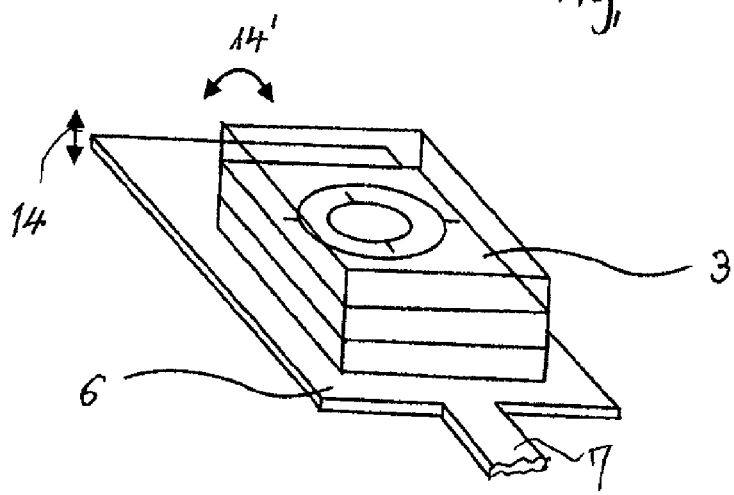
Figure 5:
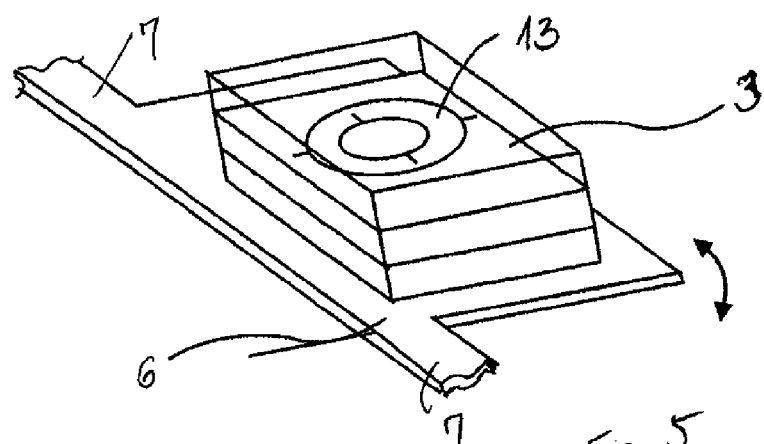

Different arrangements of the micro-actuator chip 3 on the platform 6 of the outer actuator are represented in the FIGS. 3 to 5, wherein the picture according to FIG. 3 corresponds to the arrangement according to FIG. 1. Here however, a two-pivot MEMS mirror 13 is provided. The platform 6 is tensioned in a fixed manner on two sides via the springs 7. If the resonance frequencies of the two pivots of the oscillation body are equal, then the drive signal can be designed as a superimposed drive signal which contains the resonance frequency and the frequency of the movement of the outer actuator. The two rotation pivots which are perpendicular to one another are excited at different resonance frequencies externally by way of vibration of the outer actuator, in a manner depending in a drive signal of a frequency mixture containing both frequencies.

The platform 6 is mounted or fixed at only one side in FIG. 4 and the oscillation onto the platform 6 is indicated by a translatory (up and down) movement according to arrow 14, wherein the MEMS mirror 13 is excited into oscillations about its two axes, i.e. one can only use translatory movements 14 for excitation. It is only important for the frequencies to be selected correctly. However, it can be yet more efficient one excites with a tilt movement 14' of the platform instead of only with a translation movement.

FIG. 5 shows a platform 6 with a two-sided mounting or fixation, wherein the micro-actuator chip is arranged asymmetrically with respect to the suspension of the platform 6 which is set by the springs 7, i.e. an asymmetrical spring-mass system with a two-sided fixation arises.

Figure 6:
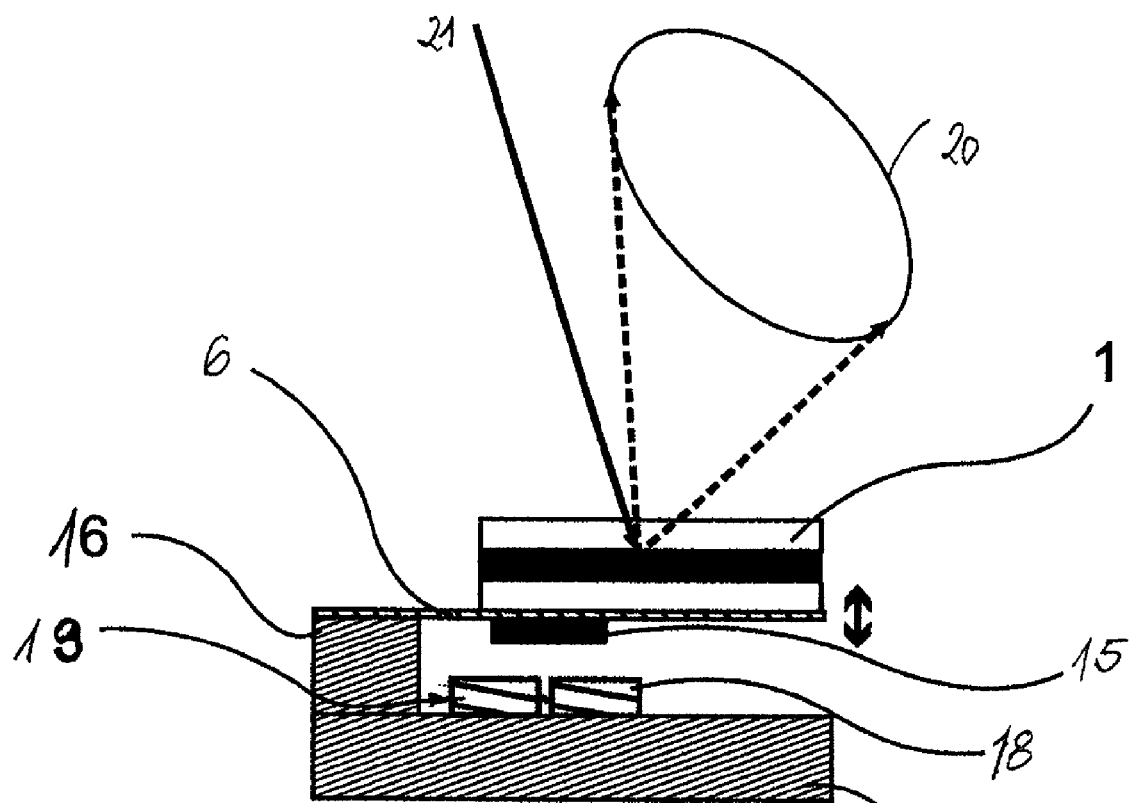

A scanner is represented schematically in section in FIG. 6, wherein the micro-actuator chip 3 as an MEMS resonator 2 comprises oscillation pivots which are perpendicular to one another. The platform of the outer actuator is indicated at 6, wherein the platform is connected in a fixed manner to a frame part 16 via a spring which is not represented further. A permanent magnet 17 is fastened on the platform 6 and cooperates with an electromagnet 18 as part of the external drive 19. The drive 19 activates its electromagnet 18 with the resonance frequency of both pivots of the micro-actuator chip 3, which is the same for both pivots. Thereby, a circular scan 20 and an incident light beam 21 are indicated. In this case, the two-pivot MEMS scanner has two identical natural frequencies which however are perpendicular to one another. The circular scan can be achieved very simply as previously, by way of the suitable excitation frequency being given to the outer actuator within the resonance bandwidth of the MEMS scanner. It is the variation of the activation frequency and the behaviour of such a scanner which are decisive as to which form the produced trajectory receives (elliptical, circular, circular with superimposed higher modes)

Figure 7:
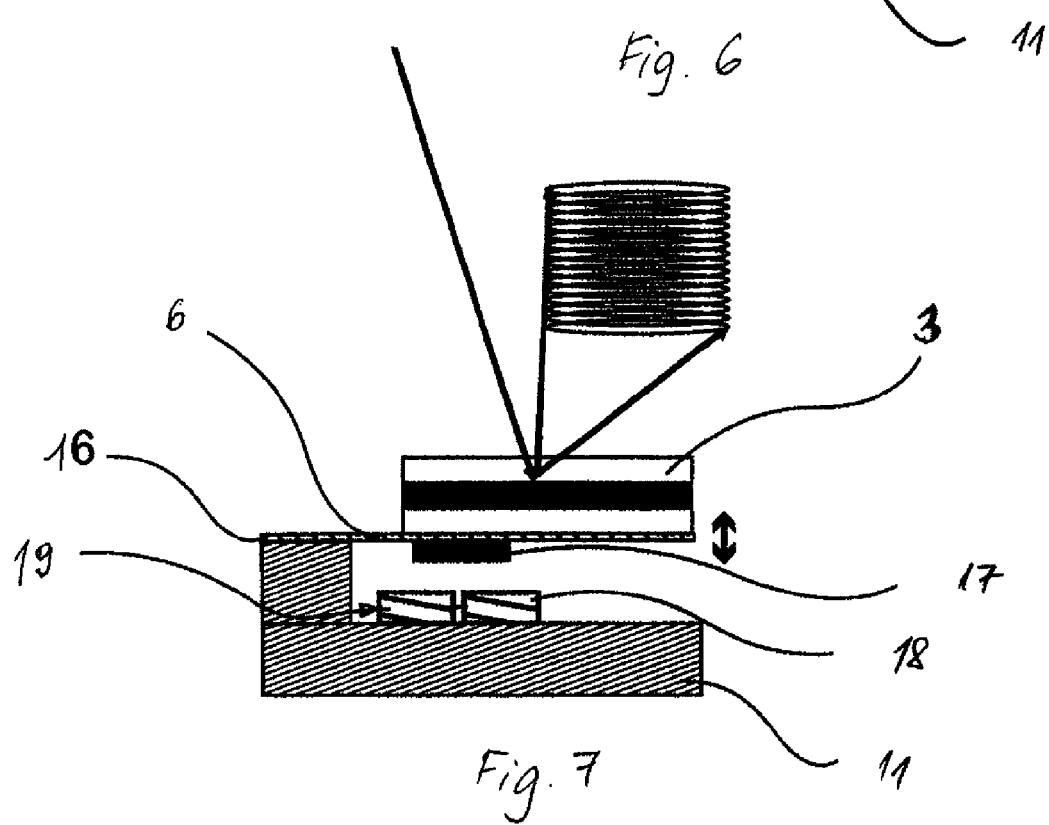

FIG. 7 shows the same construction as FIG. 6 with the difference that the drive signals for the electromagnet 18 of the external drive 19 are realised by a superposition of two signals of a different frequency. The oscillation pivots of the micro-actuator chip have different resonance frequencies, so that the scanner can carry out a Lissajous operation which is indicated by the Lissajous FIG. 22, i.e. the Lissajous trajectory comes into being with a frequency mixture of the two correct natural frequencies. An integrated position sensor system is important, in order to set and to monitor the exact temporal course.

Figure 8:
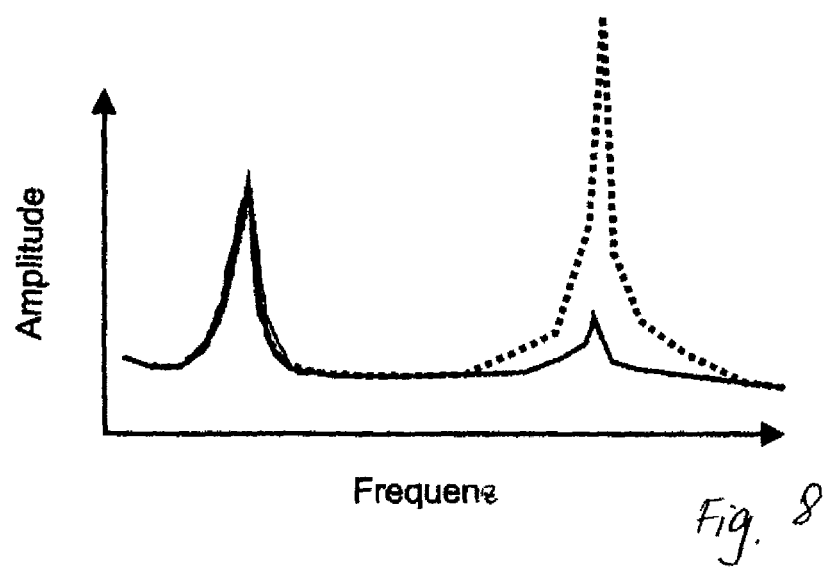

The frequency response of a micromechanical resonance arrangement e.g. according to FIG. 2 is represented in FIG. 8, wherein the unbroken line shows the frequency response of the outer actuator, i.e. of the complete system, e.g. consisting of platform, permanent magnet and the micro-actuator chip. The dashed line is the frequency response of the micro-actuator chip. The frequency of the excitation signals which are given to the electromagnet for driving is changed from small frequencies towards greater frequencies. Thereby, at a lower frequency, the complete system (outer actuator and chip) firstly displays a first resonant peak, at which the inner resonator, although co-oscillating, however is not excited into natural resonance. With a further increase of the frequency, sooner or later the natural resonance of the MEMS resonator (mirror) is excited and thereby a correspondingly large amplitude is achieved, whereas the outer actuator oscillates with an even smaller amplitude.

What is claimed is:

1. A micromechanical resonator arrangement, in particular a micro-mirror scanner, comprising:
   an inner actuator which comprises an oscillation body capable of oscillation about at least one axis, and
   an outer actuator with an oscillating part,
   wherein the inner and outer actuator form a coupled oscillation system, and the outer actuator is driven by an external drive whose drive frequency is selected in a manner such that the oscillation body of the inner actuator oscillates with one of its eigenmodes or close to this eigenmode, and
   wherein the inner actuator is at least one vacuum-encapsulated micro-actuator chip which is fastened on the oscillating part of the outer actuator.

2. The micromechanical resonator arrangement according to claim 1, wherein the outer actuator is designed as a resonant spring-mass system which as an oscillating part comprises a platform for receiving the micro-actuator chip and suspended via at least one spring.

3. The micromechanical resonator arrangement according to claim 1, wherein the design of the resonant spring-mass system with respect to the spring constant and moment of inertia is selected depending on the natural resonance frequency of the oscillatory oscillation body of the vacuum-encapsulated micro-actuator chip.

4. The micromechanical resonator arrangement according to claim 3, wherein the resonance frequency of the spring-mass system with the fastened micro-actuator chip lies below the natural resonance frequency of the micro-actuator chip.

5. The micromechanical resonator arrangement according to claim 1, wherein the external drive is designed as an electromagnetic drive, piezoelectric drive, electrostatic drive, pneumatic drive or thermo-mechanical drive.

6. The micromechanical resonator arrangement according to claim 1, wherein the outer actuator is designed as a non-resonant, regulated actuator system.

7. The micromechanical resonator arrangement according to claim 1, wherein the oscillating part of the outer actuator is designed as a platform at least partly consisting of magnetisable material or is connected to at least one permanent magnet, wherein the external drive comprises an electromagnet.

8. The micromechanical resonator arrangement according to claim 1, wherein the platform is provided with a coil which cooperates with a permanent magnet arrangement for forming a moving coil.

9. The micromechanical resonator arrangement according to claim 1, wherein the drive signals of the external drive for oscillation excitation of the outer and inner actuator is composed of at least two signals which are different with respect to the frequency and/or the signal shape.

10. The micromechanical resonator arrangement according to claim 1, wherein the oscillatory oscillation body is suspended on two orthogonal axes.

11. The micromechanical resonator arrangement according to claim 1, wherein the micro-actuator chip has an internal drive which is assigned to the oscillation body and serves for damping the oscillation of the oscillation body or for the drive of an oscillation axis of the oscillation body which is not excited by the external drive.

12. The micromechanical resonator arrangement according to claim 1, wherein the oscillating part of the outer actuator is fixedly mounted at one or two sides.

13. The micromechanical resonator arrangement according to claim 1, wherein the micro-actuator chip comprises sensors for detecting the oscillation amplitude, the oscillation frequency and/or the oscillation phase.

\* \* \* \* \*